United States Patent
Chiou et al.

(10) Patent No.: US 9,651,441 B2
(45) Date of Patent: *May 16, 2017

(54) PRESSURE SENSOR DEVICE WITH HIGH SENSITIVITY AND HIGH ACCURACY

(71) Applicant: Continental Automotive Systems, Inc., Auburn Hills, MI (US)

(72) Inventors: Jen-Huang Albert Chiou, Libertyville, IL (US); Shiuh-Hui Steven Chen, Lake Zurich, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 113 days.

This patent is subject to a terminal disclaimer.

(21) Appl. No.: 14/704,012

(22) Filed: May 5, 2015

(65) Prior Publication Data

US 2015/0330856 A1    Nov. 19, 2015

Related U.S. Application Data

(60) Provisional application No. 61/993,451, filed on May 15, 2014.

(51) Int. Cl.
| | |
|---|---|
| *G01L 9/00* | (2006.01) |
| *H01L 41/332* | (2013.01) |
| *H01L 41/23* | (2013.01) |
| *H01L 41/312* | (2013.01) |
| *H01L 41/113* | (2006.01) |
| *B81B 3/00* | (2006.01) |

(Continued)

(52) U.S. Cl.
CPC ............ *G01L 9/0054* (2013.01); *B81B 3/00* (2013.01); *B81B 7/02* (2013.01); *B81C 1/00* (2013.01); *G01L 9/0042* (2013.01); *G01L 9/0047* (2013.01); *G01L 9/0052* (2013.01); *H01L 41/1132* (2013.01); *H01L 41/23* (2013.01); *H01L 41/312* (2013.01); *H01L 41/332* (2013.01)

(58) Field of Classification Search
None
See application file for complete search history.

(56) References Cited

U.S. PATENT DOCUMENTS

| | | | |
|---|---|---|---|
| 4,236,137 A | 11/1980 | Kurtz et al. | |
| 4,570,498 A | 2/1986 | Okayama | |

(Continued)

FOREIGN PATENT DOCUMENTS

| | | |
|---|---|---|
| DE | 102005061142 A1 | 6/2007 |
| JP | H1038726 A | 2/1998 |

OTHER PUBLICATIONS

Search Report dated Mar. 27, 2015, from corresponding GB Patent Application No. GB1412246.9.

(Continued)

*Primary Examiner* — Andre Allen

(57) ABSTRACT

The voltages output from a low-pressure MEMS sensor are increased by increasing the sensitivity of the sensor. Sensitivity is increased by thinning the diaphragm of the low pressure sensor device with corner trench. Nonlinearity increased by thinning the diaphragm is reduced by simultaneously creating a cross stiffener to the bottom side of the diaphragm. A rim, anchors, and a stiffener pad can also be added to further stiffen the thinner diaphragm and further reduce pressure nonlinearity.

22 Claims, 13 Drawing Sheets

(51) Int. Cl.
B81B 7/02 (2006.01)
B81C 1/00 (2006.01)

(56) References Cited

U.S. PATENT DOCUMENTS

| | | |
|---|---|---|
| 5,156,052 A | 10/1992 | Johnson et al. |
| 5,178,016 A | 1/1993 | Dauenhauer et al. |
| 6,006,607 A | 12/1999 | Bryzek et al. |
| 6,093,579 A | 7/2000 | Sathe |
| 7,997,142 B2 | 8/2011 | Chiou et al. |
| 2009/0084182 A1 | 4/2009 | Muchow et al. |
| 2011/0023618 A1* | 2/2011 | Chiou .................. G01L 9/0042 73/727 |
| 2015/0268115 A1* | 9/2015 | Robert ................. B81B 3/0021 73/718 |

OTHER PUBLICATIONS

Michitaka Shimazoe et al; "A special silicon diaphragm pressure sensor with high output and high accuracy"; Sensors and Actuators, 1982; pp. 275-282; vol. 2.

* cited by examiner

PRESSURE SENSOR DEVICE WITH HIGH SENSITIVITY AND HIGH ACCURACY

BACKGROUND

Solid state micro-electro-mechanical system (MEMS) pressure sensors are well known. For example, U.S. Pat. No. 4,236,137 to Kurtz, et al. discloses a semiconductor pressure transducer. U.S. Pat. No. 5,156,052 to Johnson, et al. also discloses a solid state pressure transducer. U.S. Pat. No. 6,006,607 to Bryzek, et al. discloses a pressure sensor that uses a piezoresistive device. U.S. Pat. Nos. 5,178,016 and 6,093,579 also discloses solid state pressure sensors.

A well-known problem with prior art MEMS pressure sensors, which use piezoresistive devices formed into a thin silicon diaphragm, is pressure non-linearity or PNL. The PNL is a function of the silicon diaphragm's deflection. The greater the diaphragm deflection, the greater degree of output non-linearity, whether the piezoresistance is detected and measured as a voltage or current.

Output non-linearity becomes more problematic in sensors that are intended to detect low pressures, e.g., pressures below 10 kPa. Since low pressure sensing devices require very thin silicon diaphragms, the diaphragm deflection in a thin diaphragm tends to aggravate the PNL in pressure sensors that are designed to measure low pressures. Another problem with thin silicon diaphragms is that they are fragile. A major challenge is to create a diaphragm to lower or reduce PNL while improving pressure sensitivity without increasing the die size for a low pressure sensor. A solid state piezoresistive pressure sensor that can be used at low pressures and which has an improved output linearity and which is more rugged and more sensitive than those in the prior art would be an improvement.

BRIEF DESCRIPTION OF THE DRAWINGS

FIG. 6-1 is a perspective view of the bottom view of a pressure sensing element shown in FIG. 5;

FIG. 6-2 is a plan view of the bottom of an alternate embodiment of a pressure sensing element;

FIGS. 14-1 through 14-4 are plan views of alternate embodiments of a sensing element.

DETAILED DESCRIPTION

Figure 1:
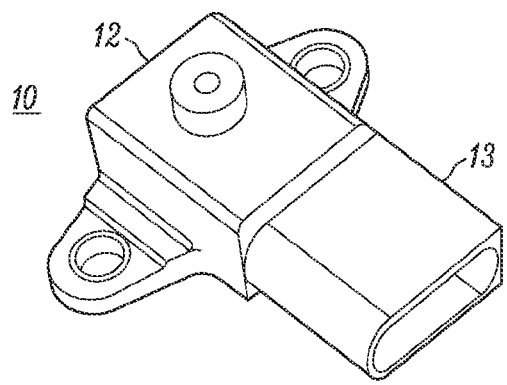
FIG. 1 and FIG. 2 are perspective views of a pressure sensor.
Figure 2:
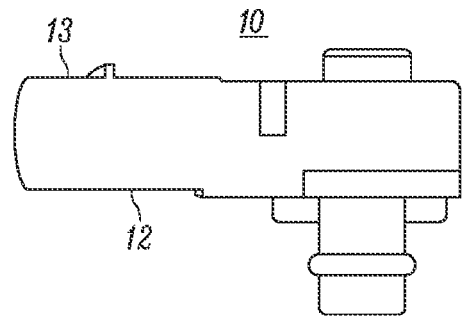
Figure 3:
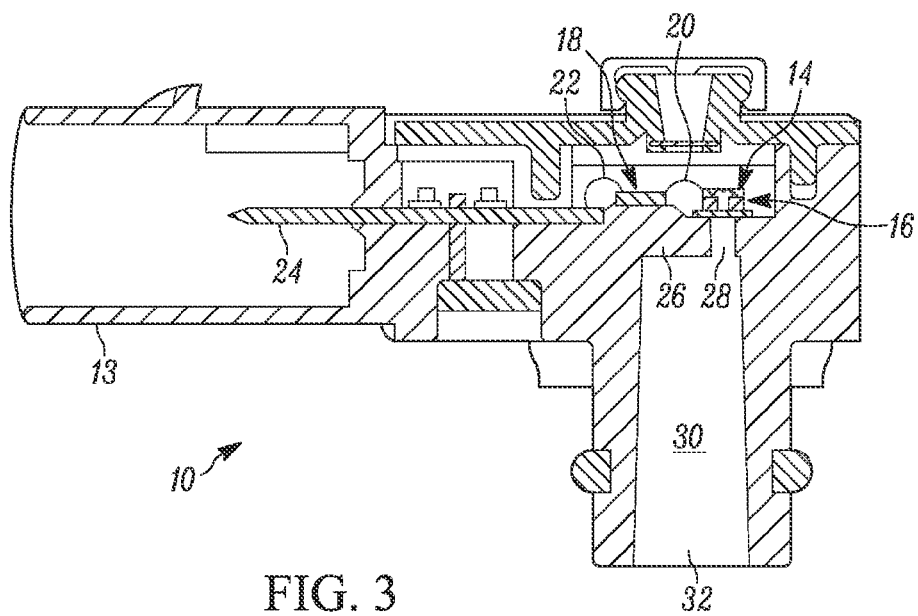
FIG. 3 is a cross-sectional view of the pressure sensor shown in FIG. 1 and FIG. 2.

FIG. 1 is a perspective view of a pressure sensor 10 for use in automotive and industrial pressure sensing applications. FIG. 2 is a side view of the pressure sensor 10. FIG. 3 is a cross-sectional diagram of the pressure sensor 10 shown in FIG. 1 and FIG. 2.

In FIGS. 1, 2 and 3, the sensor 10 comprises an injection molded plastic housing 12 that comprises an elongated, hollow shroud portion 13. The shroud 13 receives a male connector and protects one or more lead frame 24 that pass through the plastic material from which the housing 12 is made. The lead frame 24 provides electrical pathways into a pocket 16 inside the housing 12 where a pressure sensing element, identified by reference numeral 14, is mounted with die-mount adhesive above a hole 18 formed through a substrate 26. The hole 18 is aligned with an open passageway 30 of a port 32. A liquid or gas, the pressure of which is to be measured by the pressure sensing element 14, is able to pass through the passageway 30 and hole 18 in the substrate 26 and exert pressure on a diaphragm from which the pressure sensing element is made.

The pressure sensing element 14 is a diaphragm-type pressure sensing element 14 located inside a pocket 16 of the housing 12. An application-specific integrated circuit (ASIC) 18, also located inside the pocket 16 includes electronic devices to output a voltage that is proportional to changes in the resistance of one or more "distributed" piezoresistive devices formed in the sensing element 14 and which are electrically connected to each other to form a Wheatstone bridge circuit.

Figure 4:
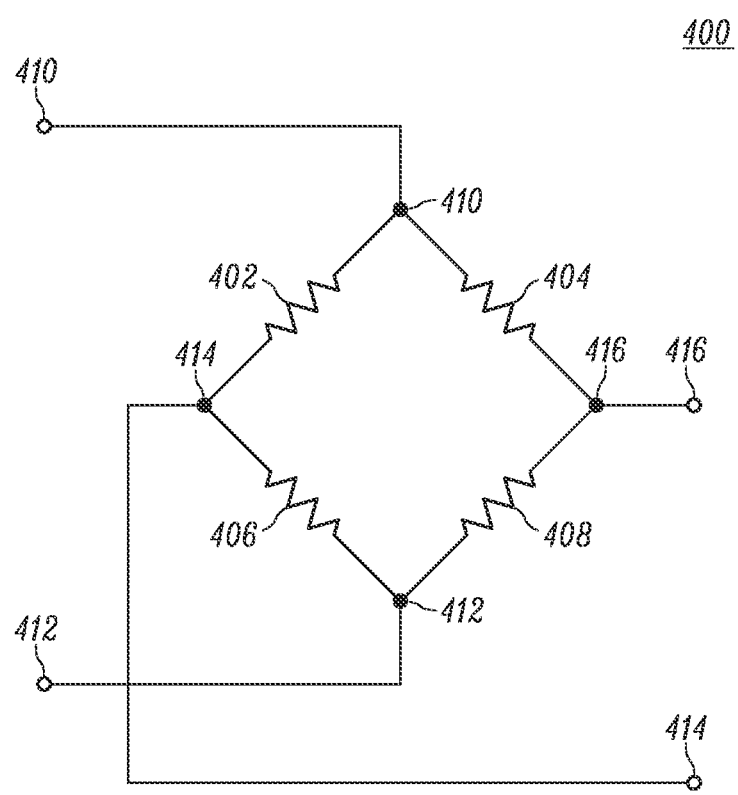
FIG. 4 depicts the topology of a Wheatstone bridge circuit.

FIG. 4 illustrates the topology of a Wheatstone bridge circuit 400, and which is used in the pressure sensing element 14. The circuit 400 comprises four separate piezoresistors 402, 404, 406 and 408 connected to each other, "end-to-end" forming a loop having four nodes where the four piezoresistors are connected together. The piezoresistors 402, 404, 406 and 408 are formed by depositing a P− semiconductor material into the top surface of a thin diaphragm made of an N epitaxial layer. The piezoresistors 402, 404, 406 and 408 are interconnected with conductors. The conductors are formed by depositing a P+ semiconductor material into the top surface of the epitaxial layer. The P− semiconductor material comprising a resistor is limited to a small area and is thus localized. The resistors are connected to each other by conductors and metal runners deposited onto the top surface of the diaphragm. Two diagonally-opposite nodes 410, 412 are considered to be input terminals; the other two diagonally-opposite nodes 414, 416 are considered to be output terminals.

Those of ordinary skill in the art will recognize that the magnitude of a voltage applied to the input terminals 410, 412 will be divided by the ratio of the piezoresistors' resistance values and output across the output terminals 414, 416. Since the piezoresistors 402, 404, 406 and 408 are formed into a thin silicon diaphragm that deflects when a pressure is applied to the diaphragm, the physical size, shape and electrical resistance of the piezoresistors 402, 404, 406 and 408 will change responsive to diaphragm deflection caused by pressure applied to the diaphragm.

Referring again to FIG. 3, the ASIC 18 includes circuitry that applies a voltage to the input terminals 410, 412 and measures the output voltage at the output terminals 414, 416. The IC 18 thus generates an electrically measurable output signal, which changes responsive to changes in the resistance of one or more resistors formed into the thin diaphragm comprising the sensing element 14. As best seen in FIG. 3, electrical signals from the electronic devices inside the ASIC 18 are routed through the housing 12 through the lead frame 24 that extends into the shroud 13 that surrounds the lead frame 24.

As used herein, a rectangle is a parallelogram, adjacent sides of which form right angles. A square is a rectangle, the sides of which have equal lengths. As described below, the pressure sensing element 14 is formed of a thin and substantially square-shaped silicon diaphragm having a cross stiffener, which can be sized, shaped and arranged to reduce non-linearity by controlling deflection of the thin diaphragm. The diaphragm and cross stiffener are formed together, i.e., at the same time, by etching material from one side of a relatively thick silicon substrate until an N epitaxial layer is reached, then etching the epitaxial layer to form the diaphragm and cross stiffener from the epitaxial layer material.

Figure 5:
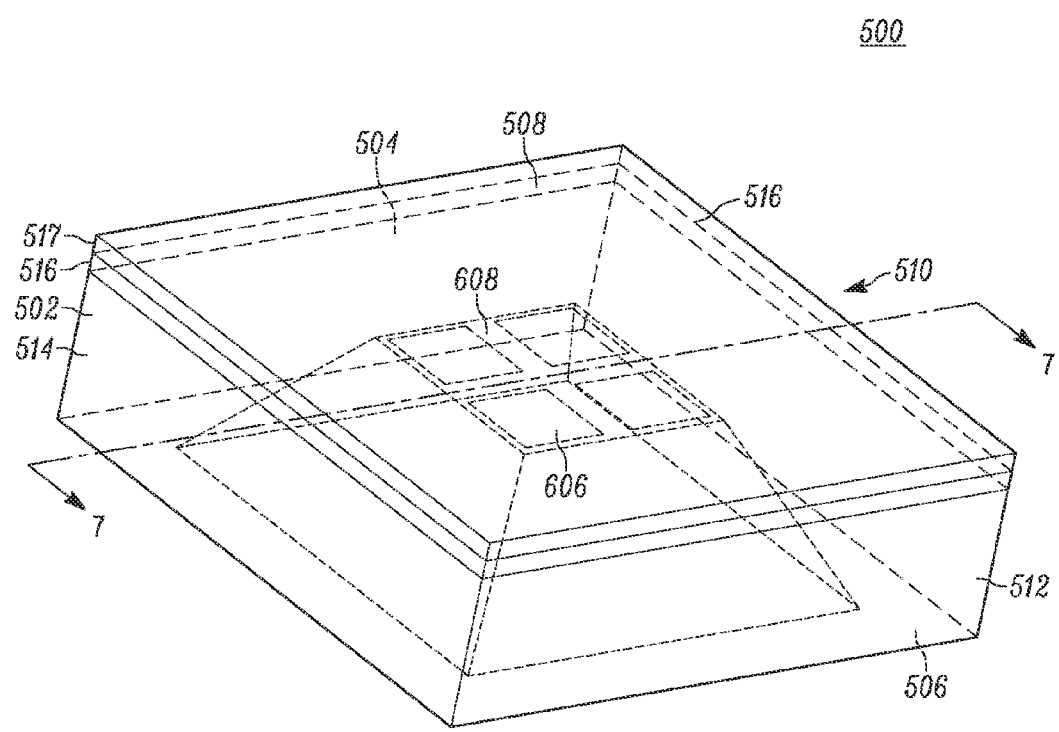
FIG. 5 is a perspective view of a pressure sensing element with high sensitivity, high accuracy and having a thin diaphragm and a cross stiffener.
Figures 1, 6:
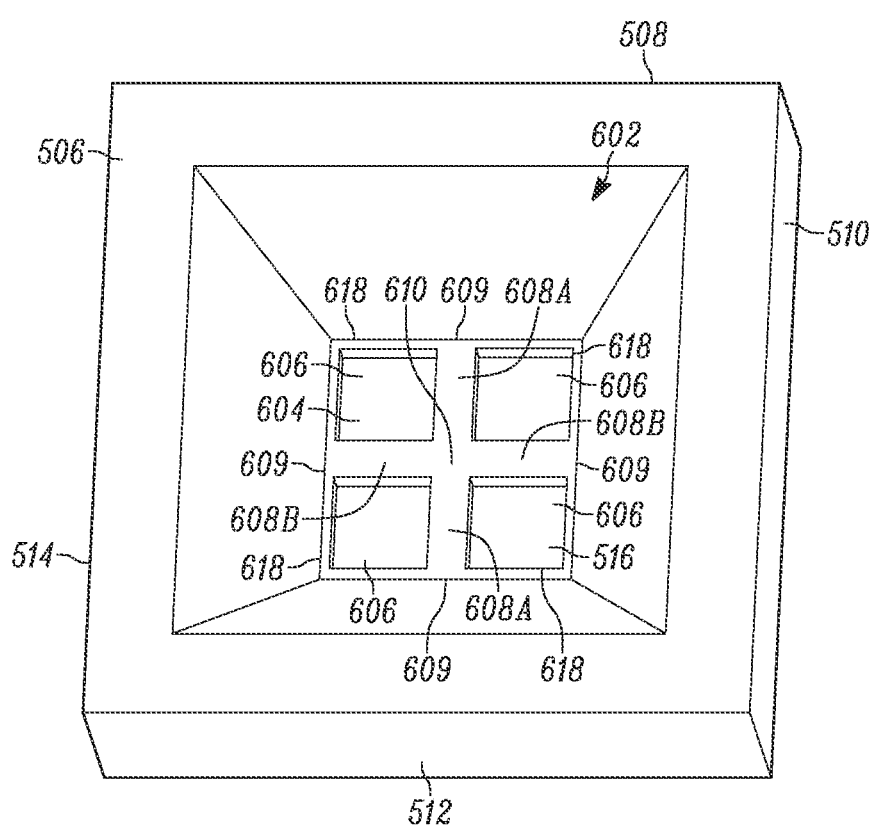
Figures 2, 6:
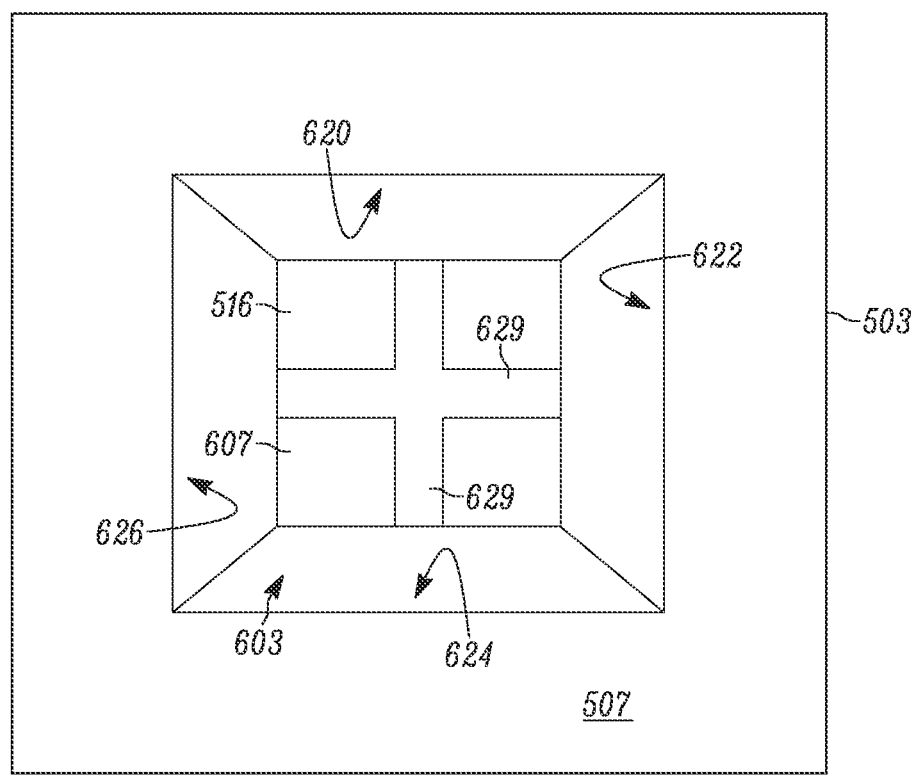
Figure 7:
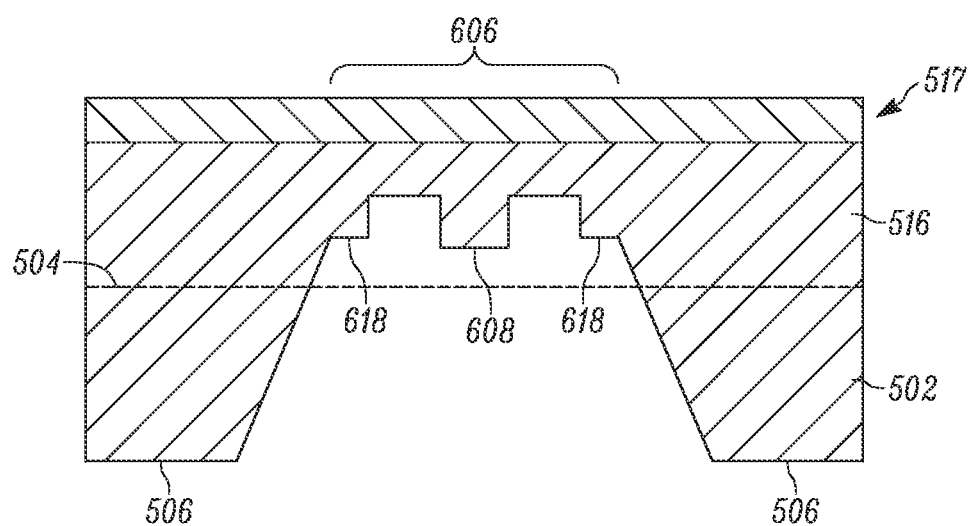
FIG. 7 is a cross sectional view of the pressure sensing element shown in FIG. 5 and FIG. 6-1.

FIG. 5 is a perspective view of the silicon substrate 500, viewed from above. FIG. 6-1 is a perspective view of the bottom of the substrate 500 shown in FIG. 5. FIG. 7 is a cross-sectional view of the substrate 500 taken through section lines 7-7.

The thickness of the diaphragm 606 is preferably between about 2.5 microns and about 5.0 microns. The diaphragm 606 having a thickness within that range easily deflects when a pressure is applied to it. As described below and as can be seen in the other figures, a cross stiffener formed under the diaphragm limits diaphragm deflection and reduces non-linearity of signals output from a pressure sensor constructed using such a pressure sensing element.

Referring now to FIG. 5, the pressure sensing element 14 comprises an essentially a rectangular parallelepiped-shaped substrate 502 made of P-type single crystalline silicon. The substrate 502 has a substantially planar top side 504 and an opposing substantially planar bottom side 506. The substrate 502 also has four substantially vertical side faces or edges 508, 510, 512 and 514. An epitaxial layer 516, formed using conventional processes, is grown or deposited on the top side 504 of the substrate 502. One or more passivation layers 517, typically formed from silicon nitride, can be deposited over the epitaxial layer 516.

FIG. 6-1 is a perspective view of the bottom 506 of the substrate 502 shown in FIG. 5, i.e., the substrate 502 when it is viewed from below. The substrate 502 has a cavity 602 formed into the bottom side 506 by a first etch, which is preferably deep reactive ion etching (DRIE) or a "wet" etch performed using potassium hydroxide (KOH). The first etch removes substrate material all the way "down" to the epitaxial layer 516 that is formed on the top side 504 of the substrate 502. Stated another way, the first etch forms a cavity 602 into the bottom side 506 of the substrate 502 that extends upwardly from the bottom 506 of the substrate 502 to the epitaxial layer 516.

After the P-type single crystalline silicon forming the substrate 502 is removed to form the cavity 602 and expose the epitaxial layer 516, a second, "dry" etch is performed inside the cavity 602 and against the bottom surface 604 of the epitaxial layer 516. The dry etch is preferably performed using "SF6," well known to those of ordinary skill in the semiconductor processing art. The second etch removes material from the epitaxial layer to thin the epitaxial layer and thus form a very thin diaphragm 606, which also has a cross stiffener 608, best seen in FIG. 6-1 and shown in cross section in FIG. 7.

In a preferred embodiment, a corner-rounding etch step is performed after the wet etch and prior to the dry etch. The corner-rounding etch eliminates or at least reduces sharp corners between intersecting surfaces formed by the wet etch and thus reduces or eliminates stress concentrations at intersecting surfaces.

Still referring to FIGS. 5, 6-1 and 7, the cross stiffer 608 essentially comprises two fixed beams 608A and 608B, i.e., both ends of each beam 608A, 608B are fixed. The beams 608A, 608B support and stiffen the diaphragm 606 and against which a pressurized fluid, i.e., a liquid or gas, applies pressure. The cross stiffener 608 thus supports a load on the diaphragm 606 that is distributed across the diaphragm 606.

The ends 609 of the beams 608A, 608B are considered to be "fixed" because the beams 608A, 608B and their ends 609 are formed as part of a rim 618, also part of the epitaxial layer 516, which extends around the perimeter of the diaphragm 606.

Although the beams 608A, 608B are formed by etching away the epitaxial layer 516, the beams are nevertheless considered herein to be joined to each other at their respective midpoints 610 and are at right angles to each other. The cross stiffener 608 is thus considered herein to be a complex fixed beam. It stiffens the diaphragm 606 thus reduces deflection of the diaphragm 606 when a pressure is applied to the diaphragm.

FIG. 6-2 is a plan view of the bottom of an alternate embodiment 600 of a pressure sensing element 500. Unlike the epitaxial layer 516 shown in FIG. 6-1, which has a rim 618 that extends around and supports the periphery of the diaphragm, in FIG. 6-2 the cross stiffener 629 formed from the epitaxial layer 516 does not have a rim. The cross stiffener 629 instead extends completely across the diaphragm 607 to where the arms of the cross stiffener are joined to, or extend from, the sloped side walls 620, 622, 624 and 626 surrounding the cavity 603, and which are formed during the first etch. Stated another way, the pressure sensing element 600 shown in FIG. 6-2 comprises a silicon substrate 503, the bottom side 507 of which is etched away to form a cavity 603 and exposes an epitaxial layer 516. The epitaxial layer 516 is then etched by SF6 to a required thickness level of a cross stiffener 629. With a photoresist covering the backside of the etched silicon substrate and patterned with the cross stiffener 629 feature, further etching with SF6 provides a corner trench to form the cross stiffener 629 without a rim. As with the embodiment shown in FIG. 6-1, the cross stiffener 629 shown in FIG. 6-2 stiffens and thus reduces deflection of the diaphragm 607 when a pressure is applied to the diaphragm 607.

In one embodiment, the sensing element is able to measure pressures between about 1.0 kilopascal and about 10.0 kilopascals. In each embodiment, the rigidity or stiffness of the cross stiffener is determined by its dimensions as well as the characteristics of the material from which it the cross stiffener is formed.

The dimensions of the cross stiffener were determined analytically and experimentally via design of experiments (DOE). For a diaphragm having a thickness between about 2.5 micrometers and about 5.0 micrometers, the height of the cross stiffener 608 should be between about 7.0 micrometers and about 10.0 micrometers and preferably about 8.5 micrometers.

Figure 8:
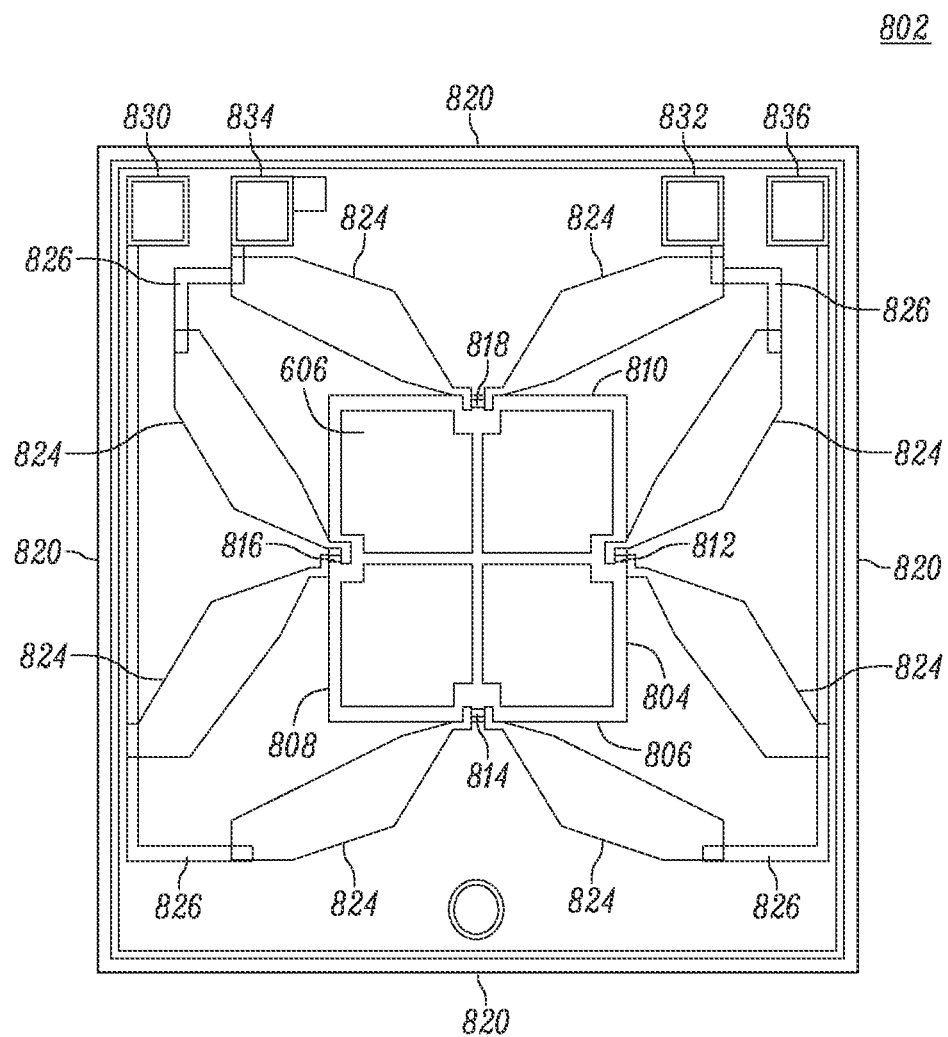
FIG. 8 is a plan view of the top side of a pressure sensing element showing a distributed Wheatstone bridge formed from piezoresistors deposited into the top side of an epitaxial layer.

FIG. 8 is a plan view of the top surface 802 of the epitaxial layer 516. The epitaxial layer is essentially square having four sides. The diaphragm region or portion 606 of the epitaxial layer 516 is also square. It too has four sides 804, 806, 808 and 810.

Four piezoresistors 812, 814, 816 and 818 are formed in small, localized regions in the top surface 802 and within the diaphragm region 606 by depositing P− type semiconductor material into the N epitaxial layer 516. As can be seen in the figure, the piezoresistors 812, 814, 816 and 818 are located at the midpoints 820 of each side 804, 806, 808 and 810 of the square-shaped diaphragm region 606.

The piezoresistors 812, 814, 816 and 818 are considered to be "distributed" elements because they are not confined to one side or edge of the diaphragm 606 but are instead separated from each other and located along the sides 804, 806, 808 and 810 of the square-shaped diaphragm 606.

The piezoresistors are connected to each other by conductors 824, which are formed by P+ conductive material deposited into the N epitaxial layer. The P+ conductors 824 extends from each end of a piezoresistor outwardly to metal runners 826, which connect to metal bond pads 830, 832, 834, 836 for the input and output voltages to form a Wheatstone bridge circuit.

Two of the P+ connectors are connected to metal runners that extend from them to metal bond pads 830 and 832 to which an input signal can be applied. Two other P+ conductors are connected to other metal runners 834, 836 which extend to a second pair of metal pads from which an output signal can be taken from the Wheatstone bridge.

Figure 9:
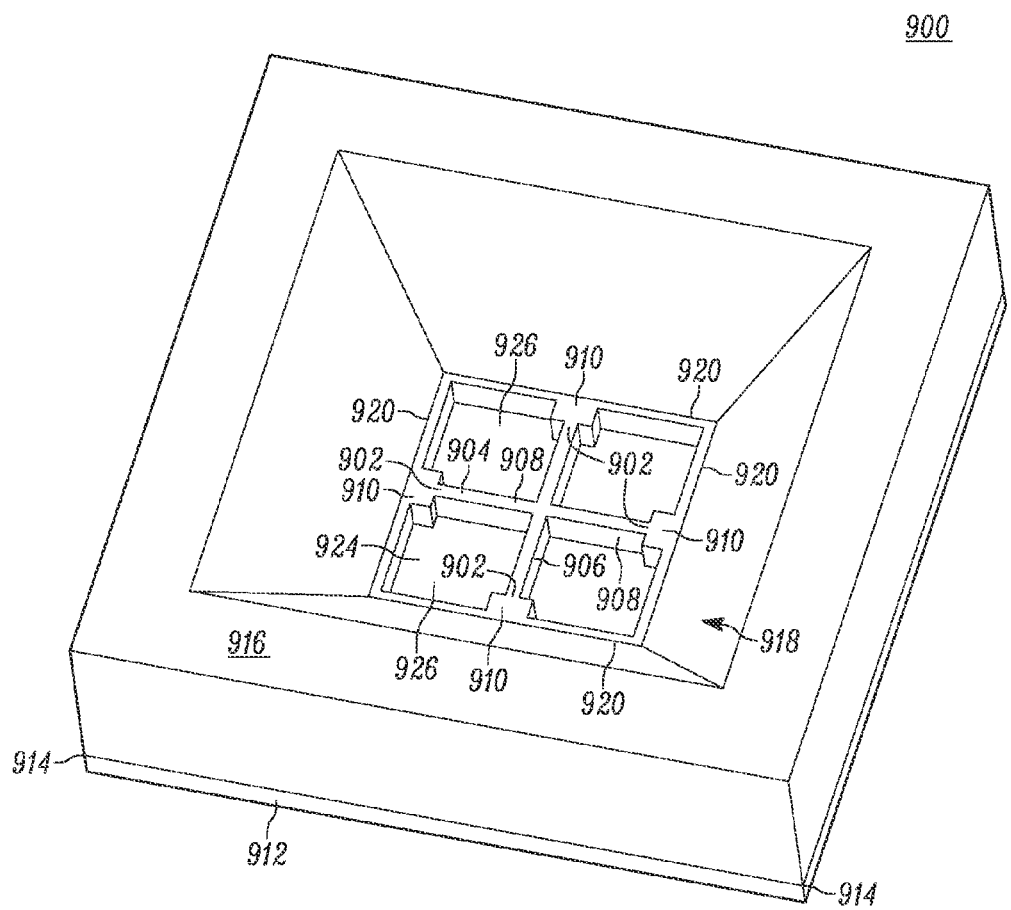
FIG. 9 is a perspective view of the bottom of a preferred embodiment of a pressure sensing element.
Figure 10:
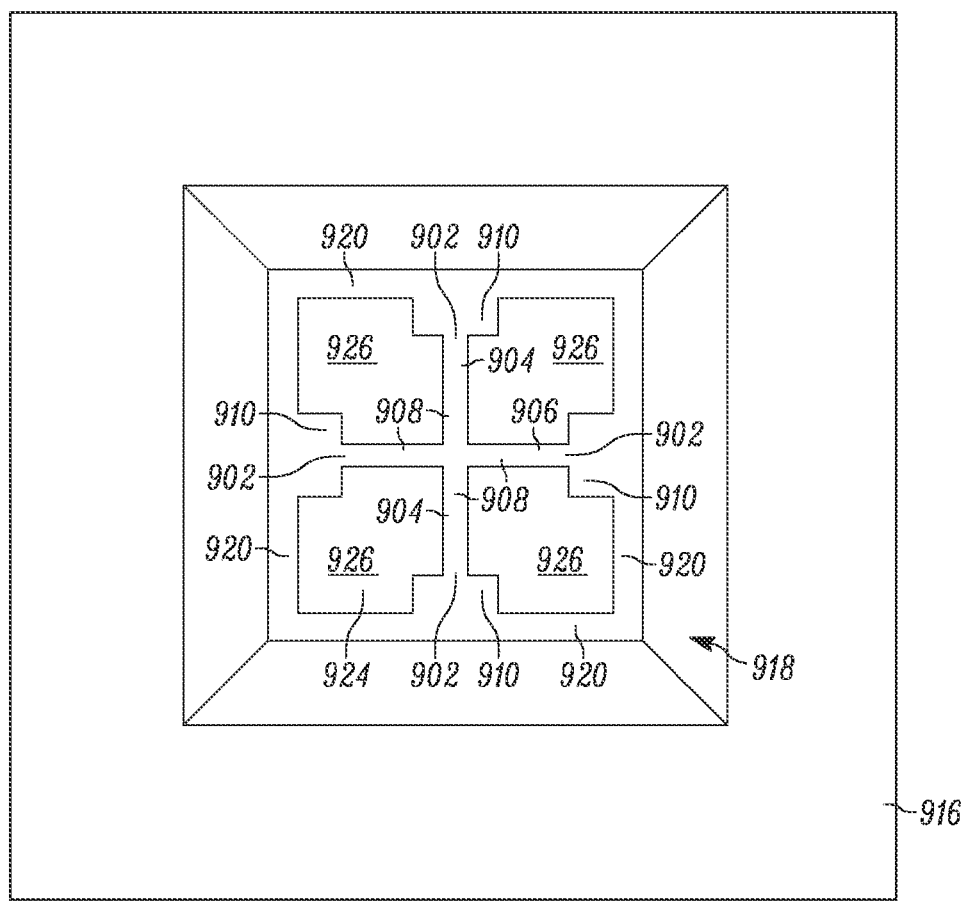
FIG. 10 is a plan view of the bottom of the pressure sensing element shown in FIG. 9.

FIG. 9 is a perspective view of the bottom a preferred embodiment of a sensing element 900. FIG. 10 is a plan view of the same preferred embodiment of a sensing element 900.

As best seen in FIG. 9, the opposing ends 902 of the two substantially orthogonal arms 904, 906 forming a cross stiffener 908 are formed, and extend away from, four cross stiffener anchors 910. Stated another way, the anchors 910, cross stiffener 908, and rim 920 are formed together by etching an epitaxial layer 912 deposited onto the top surface 914 of a single crystalline silicon substrate 916 into which a cavity 918 is etched as described above.

The anchors 910 are substantially parallelepiped-shaped blocks and are located against and extend from a rim 920, which is also formed by etching the epitaxial layer 912. The anchors 910 are formed to be located directly beneath piezoresistors (See FIG. 8.) which are formed into the top surface of the epitaxial layer 912, which is not visible in FIG. 9 or FIG. 10. The anchors 910 have a thickness selected to prevent leakage current from passing from P+ and P− into the N epitaxial layer 912 through P-N junctions.

As best seen in FIG. 10, the cross stiffener 908 is attached to the rim 920 through the anchors 910. As stated above, the cross stiffener 908 is a beam that supports a diaphragm 924 formed by thinning the epitaxial layer 1012. The cross stiffener 1008 defines four corner trenches 926.

The rim 920 supports and stiffens the perimeter of the diaphragm 924. The thinned epitaxial layer that forms the "bottom" of the trenches 926 will deflect responsive to a pressure applied to them and thereby change the shape or dimensions of the piezoresistors formed in the top surface of the epitaxial layer. The cross stiffener 908, which is a beam supporting or stiffening the diaphragm, reduces the deflection of the diaphragm 924.

Figure 11:
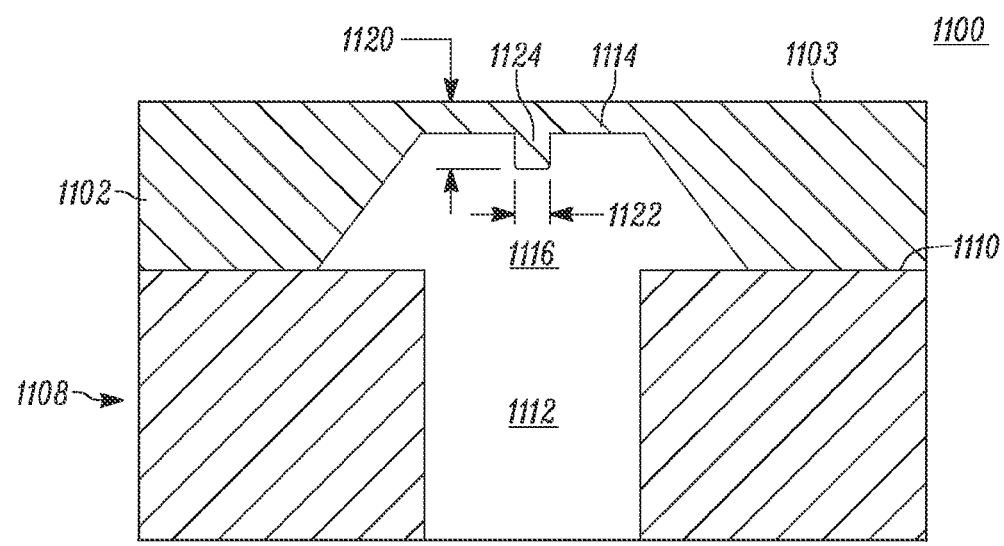
FIG. 11 is a cross sectional view of a differential pressure sensor.

FIG. 11 is a cross sectional diagram of a differential pressure sensor 1100. The pressure sensor 1100 can be formed from a sensing element 500 shown in FIG. 5, which has a rim 618 or formed from a sensing element 600 shown in FIG. 6-2 without a rim, or formed from a sensing element 900 shown in FIG. 9 with a rim and four anchors. In FIG. 11, a first substrate 1102 comprising a sensing element as depicted in FIG. 6-2 is formed in the first substrate 1102, which is then attached to and supported by a second substrate 1108. The second substrate 1108 is typically glass but can also be formed of silicon. The second substrate 1108 is attached to the bottom side 1110 of the first substrate 1102.

A hole 1112 is formed through the second substrate. The hole 1112 is aligned with the diaphragm 1114 formed in the first substrate 1102. The hole 1112 is sized, shaped and arranged to conduct a fluid, i.e. a liquid or a gas, into the cavity 1116 formed into the bottom side 1110 of the first substrate 1102. The fluid will thus exert a pressure on the bottom side of the diaphragm 1114. The deflection of the diaphragm 1114 is thus dependent on the difference between the pressure applied to the top side of the diaphragm 1114, i.e., the pressure inside the top cavity 1006, and the pressure applied to the bottom side of the diaphragm, i.e., the pressure inside the bottom or lower cavity 1116.

Changing the height 1120 and/or width 1122 of a cross stiffener 1124 supporting the diaphragm 1114 determines the deflection of the diaphragm and cross stiffener 1124 responsive to a pressure applied to them and hence the sensitivity of the sensor. Changing the dimensions of the cross stiffener 1124 thus allows the pressure sensitivity and nonlinearity to be precisely controlled. The sizes of the rim 618 in the sensing element 500 or the rim 920 and the anchors 910 in sensing element 900 also influence the pressure sensitivity and nonlinearity.

Figure 12:
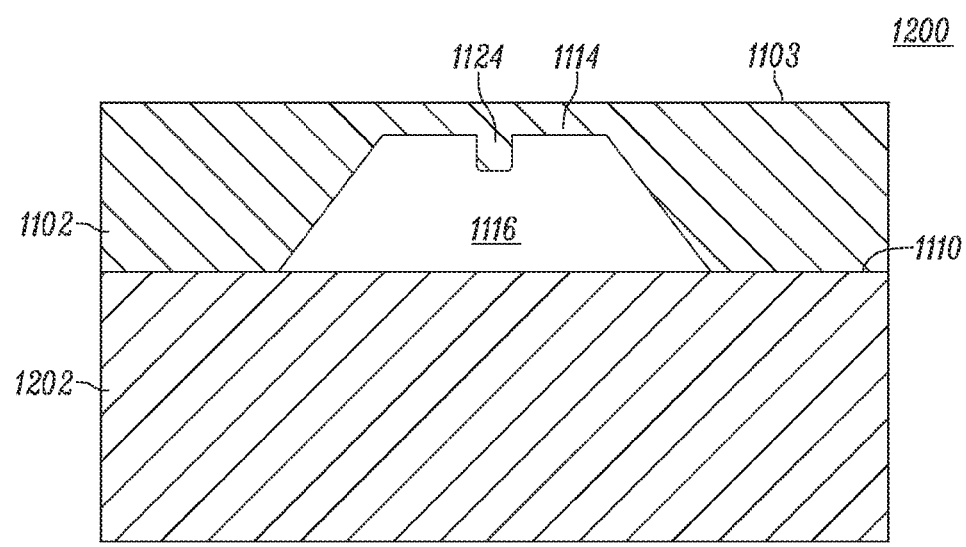
FIG. 12 is a cross sectional view of a top side absolute pressure sensor.

FIG. 12 is a cross sectional view of an absolute pressure sensor 1200. The absolute pressure sensor 1200 has a top or first substrate 1102 that is the same as the first substrate 1102 shown in FIG. 11 and described above. A second substrate 1202 is attached to the bottom side 1110 of the first substrate 1102. The second substrate 1202 does not have a hole; it closes the cavity 1116 formed into the bottom side 1110 of the first substrate 1120.

If the cavity 1116 is evacuated when the second substrate 1202 is attached, a pressure or vacuum applied to the top side 1103 of the first substrate 1102 will cause the diaphragm 1114 to deflect, changing the resistance of piezoresistors formed into the diaphragm.

Figure 13:
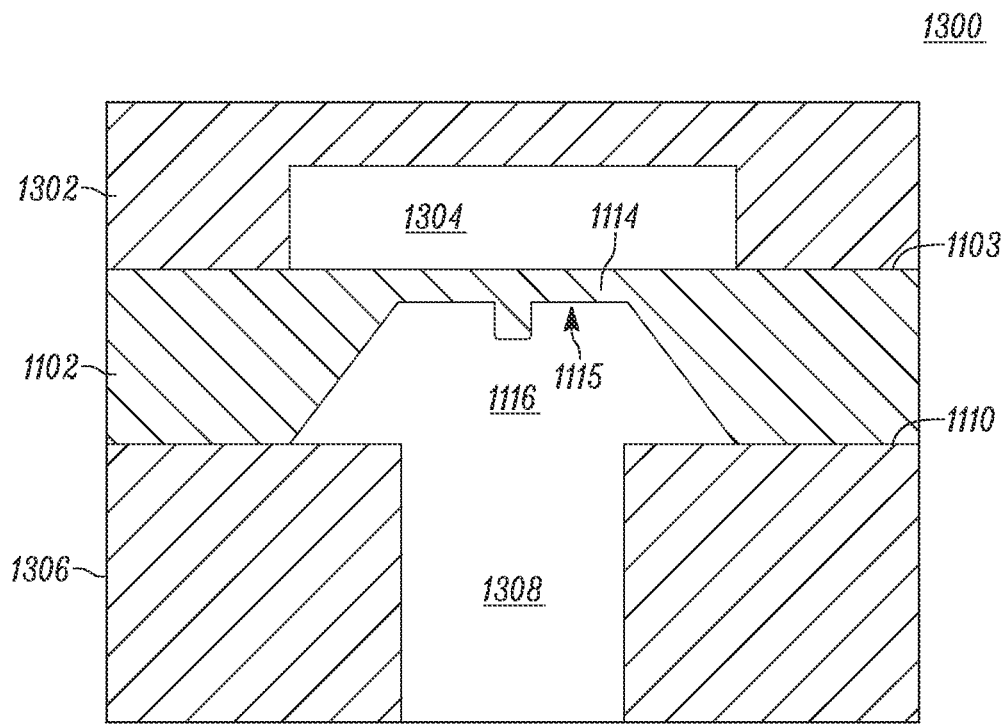
FIG. 13 is a cross sectional view of a backside absolute pressure sensor.

FIG. 13 is a cross sectional view of a backside absolute pressure sensing element 1300. A cap 1302 applied to the top side 1103 of the first substrate 1102 shown in FIG. 11 provides an evacuated cavity 1304 above the diaphragm 1114. A second substrate 1306 applied to the bottom side 1110 of the first substrate 1102 has a hole 1308 aligned with the diaphragm 1114 through which fluid can pass into the cavity 1116 formed in the first substrate 1102. The hole 1308 enables pressurized fluids to exert pressure on the bottom or backside 1115 of the diaphragm 1114. The net deflection of the diaphragm 1114 is determined by the pressure in the top cavity 1304 and the bottom or backside cavity 1116.

Figures 1, 14:
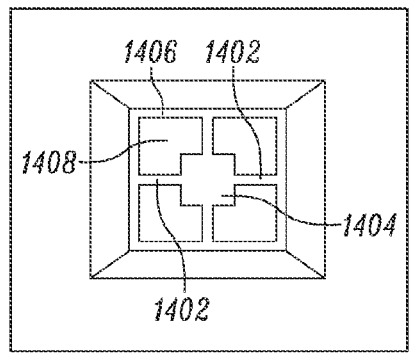
Figures 2, 14:
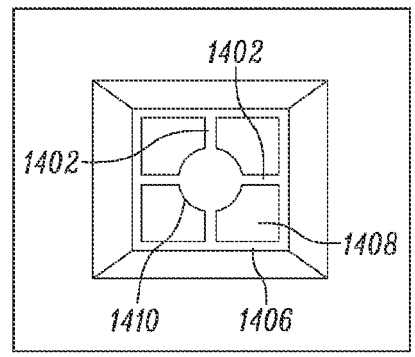
Figures 3, 14:
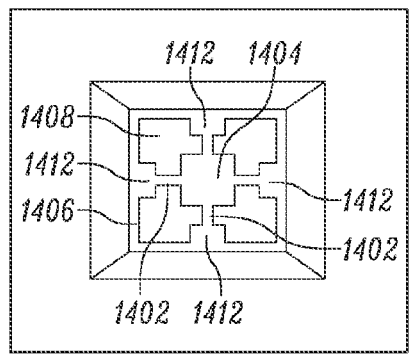
Figures 4, 14:
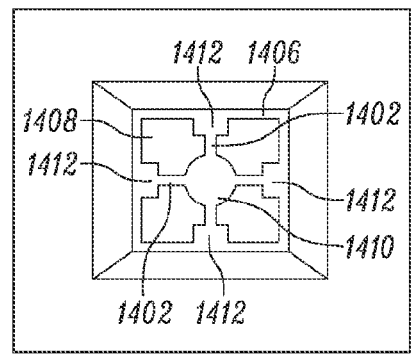

Experimentation revealed that the cross stiffeners described above and shown in FIGS. 3-13 can also be formed with a centrally-located diaphragm-stiffening pad. FIGS. 14-1-14-4 are bottom vies of alternate embodiments of cross stiffeners. In FIG. 14-1, a cross stiffener 1402 is formed without anchors but extends from a centrally-located square pad 1404 outwardly to a rim 1406 that extends around the perimeter of a diaphragm 1408.

In FIG. 14-2, the cross stiffener 1402 extends from a substantially round or circular pad 1410 to the rim 1406.

In FIG. 14-3, the cross stiffener 1402 extend from anchors 1412 located at the midpoint of each side of the rim 1406 inwardly to a substantially square shaped pad 1404.

Finally, in FIG. 14-4, the centrally-located pad 1410 is also circular or round. The cross stiffener 1402 extends outwardly from it to anchors 1412.

In a preferred embodiment, the diaphragm thickness is between about 2.5 microns and about 5 microns. The cross stiffener, however, had a thickness between about 5.0 microns and about 10.0 microns but can be up to 15.0 microns in thickness.

As noted above, the stiffener and the diaphragm are formed from the same epitaxial layer. In an alternate embodiment, however, the stiffener can be deposited on to the bottom side of the epitaxial layer using a different material from which the diaphragm is formed.

Figure 15:
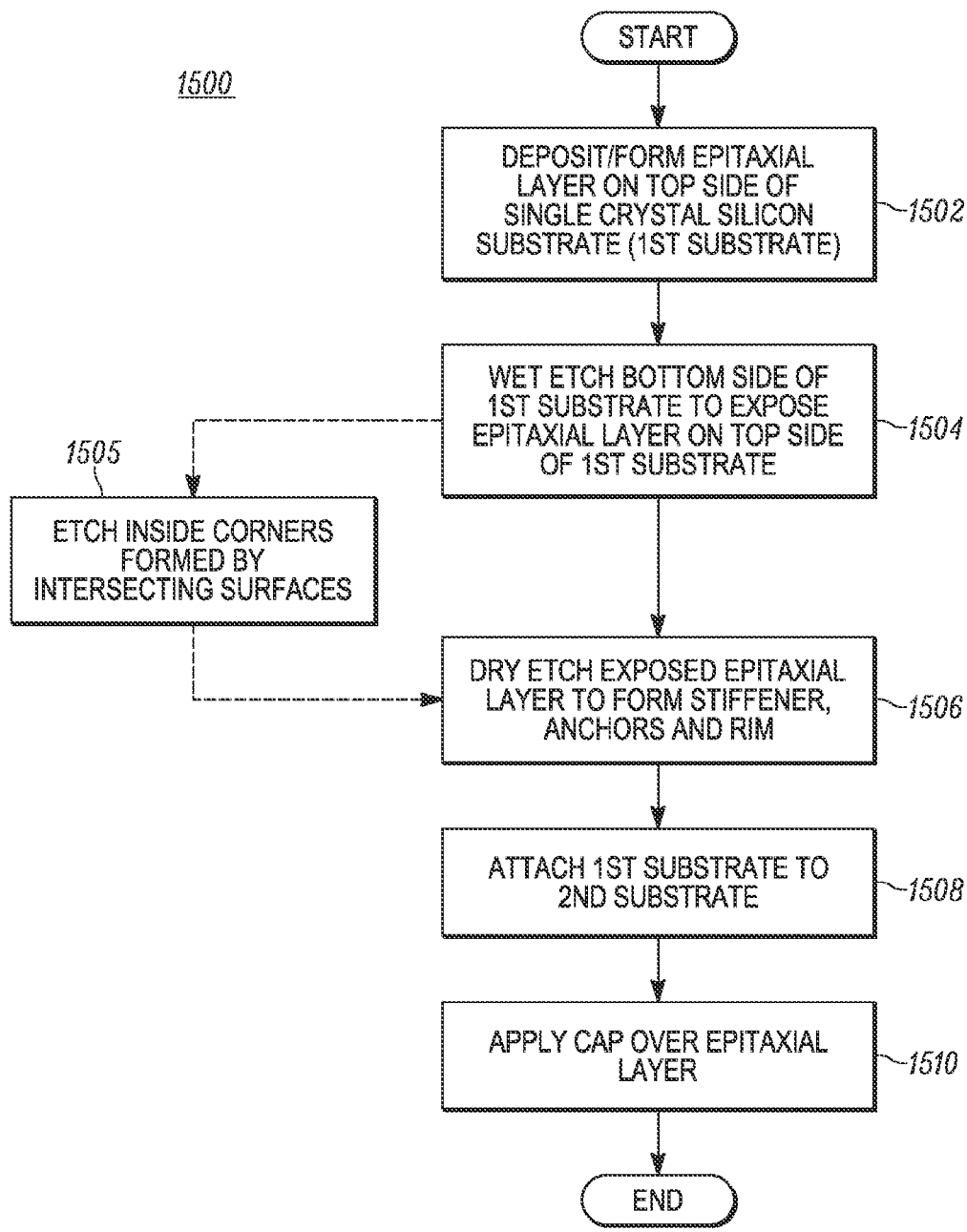
FIG. 15 is a flow chart showing steps of a method of forming a pressure sensor device having high sensitivity and high accuracy using a cross stiffener.

FIG. 15 is a flow chart showing steps of the method of forming the pressure sensing element described above.

At a first step 1502, an epitaxial layer is formed on a top side of a single crystal silicon substrate. The thickness of the epitaxial layer is thin, preferably less than about 20 microns.

At a second step 1504, the bottom side of the single crystal silicon layer is etched to define or form a cavity. The first etch removes all of the single crystalline layer material "down" to the epitaxial layer exposing the bottom surface of the epitaxial layer for a subsequent etching step.

In a third step 1506, a second etch is performed on the epitaxial layer to remove material from the epitaxial layer to define a cross stiffener, a rim, or anchors and if desired, a stiffener pad described above.

In a preferred embodiment, a corner rounding etching step 1505 is optionally performed after the cavity is etched into the bottom side of the first substrate and prior to etching the epitaxial layer. The cornering rounding etch step essentially rounds interior corners and reduces stress concentrations that would otherwise develop without the corner rounding etching.

At a fifth step 1508, the substrate having the epitaxial layer is attached to a second substrate, which is considered to be a support for the first substrate. The second substrate can have a hole formed through it depending upon whether the resultant pressure sensing element is to be a differential pressure sensor or topside absolute pressure sensor.

Finally, at step 1510, a cap is applied to the top side of the first substrate to define an evacuated cavity above the diaphragm.

Those of ordinary skill in the art will appreciate that a cross stiffener as described above will support and thus control deflection of a thin diaphragm. The cross stiffener dimensions, (height, width and length) can be determined experimentally or through computer modeling to stiffen a diaphragm as desired. A diaphragm can thus be made very thin, in combination with a cross stiffener, rim, and/or anchors, to increase its sensitivity and accuracy, as described in more detail above.

The foregoing description is for purposes of illustration only. The true scope of the invention is set forth in the following claims.

What is claimed is:

1. A pressure sensing element comprising:
   a first substrate having top and bottom opposing sides;
   a diaphragm formed into the bottom of the first substrate, the diaphragm having top and bottom opposing sides, the top side of the diaphragm comprising spaced-apart piezoresistors coupled to each other to form a Wheatstone bridge;
   a rim, which is formed as part of the bottom of the diaphragm and which supports and stiffens a perimeter region of the bottom of the diaphragm; and
   a cross-stiffener, formed as part of the diaphragm on the bottom side of the diaphragm whereby the rim and the cross-stiffener improve the diaphragm's accuracy.

2. The pressure sensing element of claim 1, further comprising a second substrate attached to the bottom of the first substrate.

3. The pressure sensing element of claim 1, further comprising a second substrate attached to the bottom of the first substrate, the second substrate having a hole, which is aligned with the diaphragm and configured to conduct a fluid toward the bottom side of the diaphragm.

4. The pressure sensing element of claim 3, further comprising a cap that covers the top side of the diaphragm and which defines a cavity above the top side of the diaphragm.

5. The pressure sensing element of claim 1, wherein the diaphragm is substantially square and wherein the cross-stiffener comprises first and second substantially orthogonal beam sections that extend between the rim.

6. The pressure sensing element of claim 1, further comprising:
   anchors, which are formed, with a minimum thickness of 7 microns to prevent leakage current from passing into the epitaxial layer through P-N junctions, as part of the bottom of the diaphragm and located between an end of a beam section and the rim; and
   wherein the cross-stiffener comprises first and second substantially orthogonal beam sections, which are formed as part of the bottom of the diaphragm, each beam section having first and second opposing ends.

7. The pressure sensing element of claim 6, wherein the piezoresistors are formed into the top side of the diaphragm and located above the anchors formed as part of the bottom side of the diaphragm.

8. The pressure sensing element of claim 1, further comprising a stiffener pad formed as part of the bottom of the diaphragm and which is substantially centered on the bottom side of the diaphragm, and wherein the cross-stiffener extends from the stiffener pad to the rim.

9. The pressure sensing element of claim 8, wherein the stiffener pad has a shape which is substantially square.

10. The pressure sensing element of claim 8, wherein the stiffener pad has a shape which is substantially circular.

11. The pressure sensing element of claim 6, further comprising a stiffener pad formed as part of the bottom of the diaphragm and which is substantially centered on the bottom side of the diaphragm, and wherein the cross-stiffener extends from the stiffener pad to the anchors.

12. The pressure sensing element of claim 11, wherein the stiffener pad has a shape which is substantially square.

13. The pressure sensing element of claim 11, wherein the stiffener pad has a shape which is substantially circular.

14. The pressure sensing element of claim 1, wherein the diaphragm has a thickness between about 2.5 and about 5.0 microns and wherein the cross-stiffener has a different thickness, which is between about 5.0 and about 15.0 microns.

15. The pressure sensing element of claim 1, wherein the cross-stiffener is formed from a material that is different from the material from which the diaphragm is formed.

16. A pressure sensor comprising:
   a housing having a pocket; and
   a pressure sensing element located in the pocket, the pressure sensing element comprising:

a first substrate having top and bottom opposing sides;

a diaphragm formed into the bottom of the first substrate, the diaphragm having top and bottom opposing sides, the top side of the diaphragm comprising spaced-apart piezoresistors coupled to each other to form a Wheatstone bridge;

a rim, which is formed as part of the bottom of the diaphragm and which supports and stiffens a perimeter region of the bottom of the diaphragm; and a cross-stiffener formed as part of the diaphragm on the bottom side of the diaphragm whereby the rim and the cross-stiffener improve the diaphragm's accuracy.

17. A method of forming a pressure sensing element, the method comprising the steps of:

forming an epitaxial layer on a top side of a first substrate, which comprises silicon;

performing a first etch on a bottom side of the first substrate, the first etch forming a cavity in a bottom side of the first substrate that extends upwardly in the first substrate to the epitaxial layer; and performing a second etch of a portion of the epitaxial layer that is exposed by the cavity, the second etch removing material from the epitaxial layer to define a cross-stiffener, a rim, and a diaphragm formed of the same material such that the rim and the cross-stiffener improve the diaphragm's accuracy.

18. The method of claim 17, further comprising the step of:

performing a corner rounding etch step between the first and second etch steps, the corner rounding etch step comprising a dry etch, which rounds interior corners formed by the first etch step.

19. The method of claim 17, wherein the step of performing a second etch defines a diaphragm thickness between about 2.5 and 5.0 microns and defines cross-stiffener thickness between about 5.0 and about 15.0 microns.

20. The method of claim 17, further comprising the step of: attaching the first substrate to a second substrate, which supports the first substrate.

21. The method of claim 17, further comprising the step of attaching the first substrate to a second substrate having a hole aligned with the diaphragm, the hole allowing a fluid to be applied to the diaphragm.

22. The method of claim 21, further comprising the step of attaching a cap to the top side of the first substrate, the cap defining a cavity above the top side of the diaphragm.

* * * * *